United States Patent [19]
Birke

[11] Patent Number: 6,028,266
[45] Date of Patent: Feb. 22, 2000

[54] LOW FREQUENCY EMF SHIELD

[75] Inventor: Paul Birke, Guelph, Canada

[73] Assignee: Asea Brown Boveri Inc., Guelph, Canada

[21] Appl. No.: 09/055,514

[22] Filed: Apr. 6, 1998

[51] Int. Cl.[7] .................................................. H05K 9/00
[52] U.S. Cl. ...................................................... 174/35 MS
[58] Field of Search .................................... 428/683, 626; 174/35 R, 35 MS, 35 TS, 36; 361/800, 816, 818; 336/84 R, 84 C, 84 M

[56] References Cited

U.S. PATENT DOCUMENTS

| | | | |
|---|---|---|---|
| 3,982,058 | 9/1976 | Hill | 174/2 |
| 4,012,706 | 3/1977 | Westendorp | 336/84 |
| 4,156,862 | 5/1979 | Hansen et al. | 336/73 |
| 4,227,037 | 10/1980 | Layton | 174/35 MS |
| 4,430,520 | 2/1984 | Tibbetts et al. | 174/35 R |
| 4,484,171 | 11/1984 | McLoughlin | 336/84 R |
| 4,749,979 | 6/1988 | Krieger | 336/84 M |
| 5,025,489 | 6/1991 | Yamaguchi | 219/760 |
| 5,055,362 | 10/1991 | McCormick et al. | 428/683 |
| 5,066,937 | 11/1991 | Moran | 336/84 C |
| 5,147,729 | 9/1992 | Ogishi et al. | 428/623 |
| 5,187,327 | 2/1993 | Ohta et al. | 174/35 R |
| 5,241,132 | 8/1993 | McCormack | 174/35 MS |
| 5,400,088 | 3/1995 | Jones | 348/819 |
| 5,402,323 | 3/1995 | Schwenk et al. | 361/816 |
| 5,483,423 | 1/1996 | Lewis et al. | 361/816 |
| 5,504,659 | 4/1996 | Acatay et al. | 361/816 |
| 5,566,055 | 10/1996 | Salvi, Jr. | 361/816 |
| 5,572,121 | 11/1996 | Beswick | 324/234 |

*Primary Examiner*—Dean A. Reichard
*Assistant Examiner*—Hung V Ngo
*Attorney, Agent, or Firm*—Gowling, Strathy & Henderson

[57] ABSTRACT

A low frequency electromagnetic field shielding panel having a first domain refined steel sheet with an easy direction parallel to a first axis and a second domain refined steel sheet substantially overlying the first sheet and having an easy direction generally orthogonal to the easy direction of the first sheet. The EMF shielding panels are interspersed between an EMF source and a critical volume rather than encapsulating the source or the critical volume.

14 Claims, 3 Drawing Sheets

LOW FREQUENCY EMF SHIELD

FIELD OF THE INVENTION

This invention relates generally to electromagnetic field (hereinafter "EMF") shielding and more particularly to EMF shields for shielding against low magnitude, low frequency, electromagnetic fields.

BACKGROUND OF THE INVENTION

Prior EMF shields have generally been designed to shield against high frequency fields in the range of frequencies typically associated with transformer or radio frequencies. Prior EMF shields generally surround either an EMF source to contain the field or surround a critical volume to isolate the volume from the field. Such typical prior EMF shields are disclosed in the following U.S. patents:

| | |
|---|---|
| 4,012,706 | Westendorp |
| 4,156,862 | Hansen |
| 4,227,037 | Layton |
| 4,430,520 | Tibbitts |
| 4,484,171 | McLoughlin |
| 4,479,979 | Krieger |
| 5,025,489 | Yamaguchi |
| 5,066,937 | Moran |
| 5,241,132 | McCormack |
| 5,187,327 | Ohta |
| 5,402,323 | Schwenk |
| 5,483,423 | Lewis |
| 5,504,659 | Acatay |
| 5,566,055 | Salvi |
| 5,572,121 | Beswick |

Recently, concern has been arising over the effect of low magnitude low frequency magnetic fields such as typically arise from electrical wiring carrying AC current at around 50 to 60 hertz. Such fields are common in office buildings and similar structures where a considerable amount of wiring runs through a building structure to provide electrical power for equipment and lighting. In such applications, the extensive network of wiring makes it impractical to either shield the myriad of sources or to isolate the numerous critical volumes.

It is an object of the present invention therefore to provide an EMF shield which is effective against low magnitude, low frequency magnetic fields, which is easily installable in new installations or retrofittable to existing installations.

It is a further object of the present invention to provide an EMF shield effective against low magnitude, low frequency fields, without requiring containment of the field around a source or isolation of a critical volume.

It is a still further object of the present invention to provide an EMF shield in panel form which can be used to build an effective EMF shield wall.

SUMMARY OF THE INVENTION

A low frequency EMF shield panel comprising:
a first sheet of domain refined steel sheet having an easy direction parallel to a first axis; and,
a second sheet of domain refined steel sheet substantially overlying said first sheet and having an easy direction generally orthogonal to said easy direction of said first sheet.

DESCRIPTION OF DRAWINGS

Preferred embodiments of the present invention are described below with reference to the accompanying drawings in which.

DESCRIPTION OF PREFERRED EMBODIMENTS

A low frequency EMF shield panel according to the present invention is generally indicated by reference 10 in the figures. The EMF shield panel 10 is made up of first and second sheets of domain refined steel; 12 and 14 respectively, substantially overlying one another.

Domain refined steels are commonly used in transformer applications because they contribute less to eddy current losses in transformer cores than do unrefined steels. The domain refining decreases the width of magnetic domains in the steel sheet. Domain refining results in a steel sheet with anisotropic magnetic permeability properties. Typically the magnetic permeability of a domain refined steel sheet will be 60 to 100 times greater in an "easy" direction than in "non-easy" direction generally perpendicular to the "easy" direction. This is somewhat analogous to light passing through a polarized filter.

Domain refining may be carried out through chemical, mechanical or laser etching processes. A domain refined steel which has proven particularly advantageous in the present invention is manufactured by Nippon Steel Corporation under the designation ZDKH which is manufactured by irradiating the surface of a steel sheet with a high output laser beam. This virtually instantaneously vaporizes and scatters the near surface layer forming local elastic and plastic regions in the electrical steel sheet and refining the magnetic domains.

Figure 2:
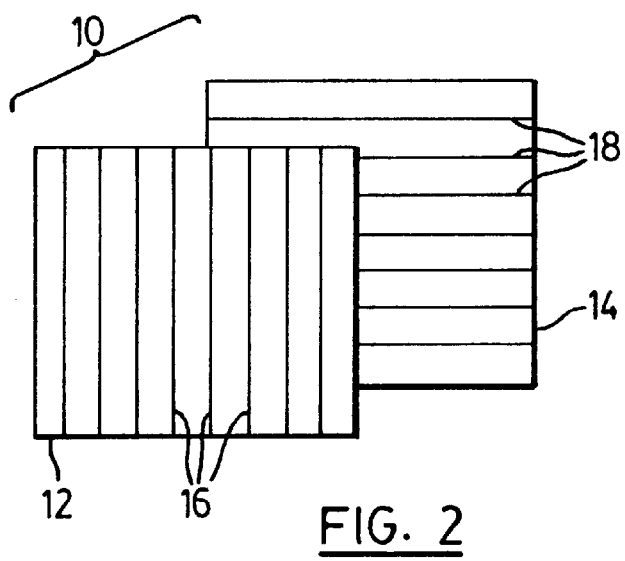
FIG. 2 is an exploded view of an EMF shield panel according to the present invention.
Figure 3:
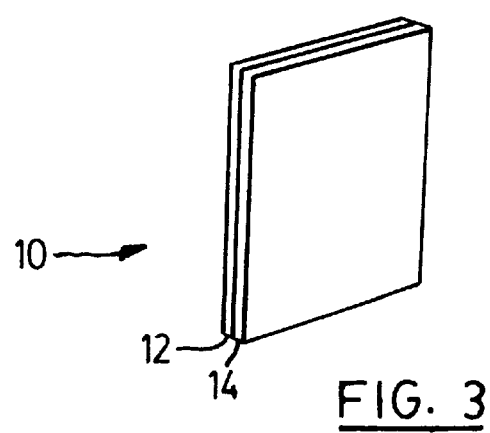
FIG. 3 is a perspective view of an EMF shield panel according to the present invention.

According to the present invention, the first and second domain refined sheets, 12 and 14 respectively, are adhesively bonded and oriented with their respective easy directions generally orthogonal to each other. Lines 16 in FIG. 2 lie along the easy direction of the first sheet 12 and are used to illustrate the easy direction of the first sheet 12. Lines 18 in FIG. 2 lie along the easy direction of the second sheet 14 and are used to illustrate the easy direction of the second sheet 16.

Figure 5:
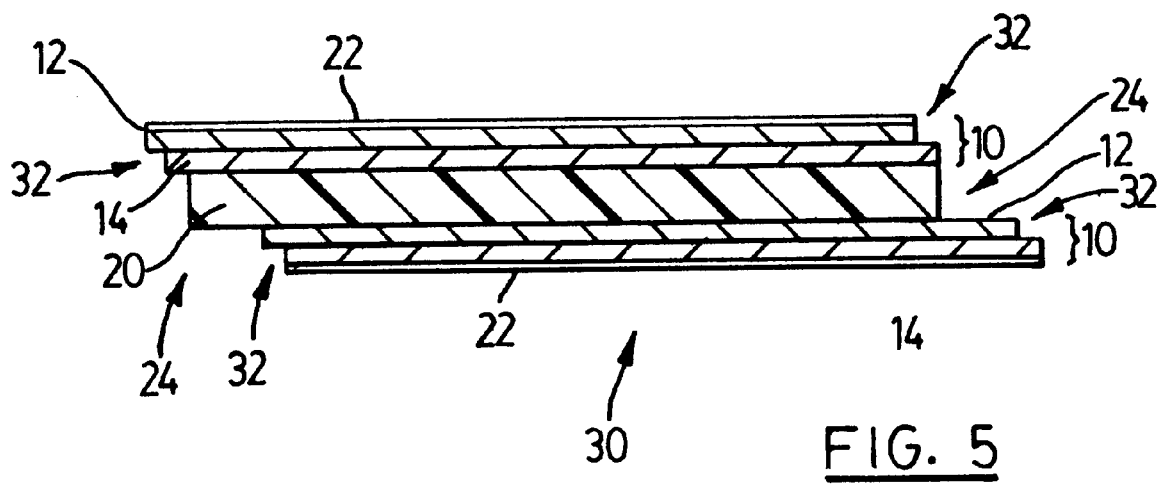
FIG. 5 is an end elevation corresponding to FIG. 4.

In a preferred embodiment illustrated in FIG. 5, an EMF shield 30 is built up from two sets of EMF shield panels to as described above mounted parallel and substantially adjacent one another with a spacer sheet 20 interposed therebetween. The spacer sheet 20 would typically maintain a separation of from 5 mm to 10 mm between the EMF shield panels 10. The spacer sheet 20 would typically exhibit little or no magnetic field shielding capabilities and may for example be made from wood or plastic.

A corrosion inhibiting coating 22 in FIG. 5 may also be provided on at least the outer surfaces of the first and second EMF shield panels 10 respectively. The corrosion inhibiting coating 22 may for example be an epoxy.

Figure 4:
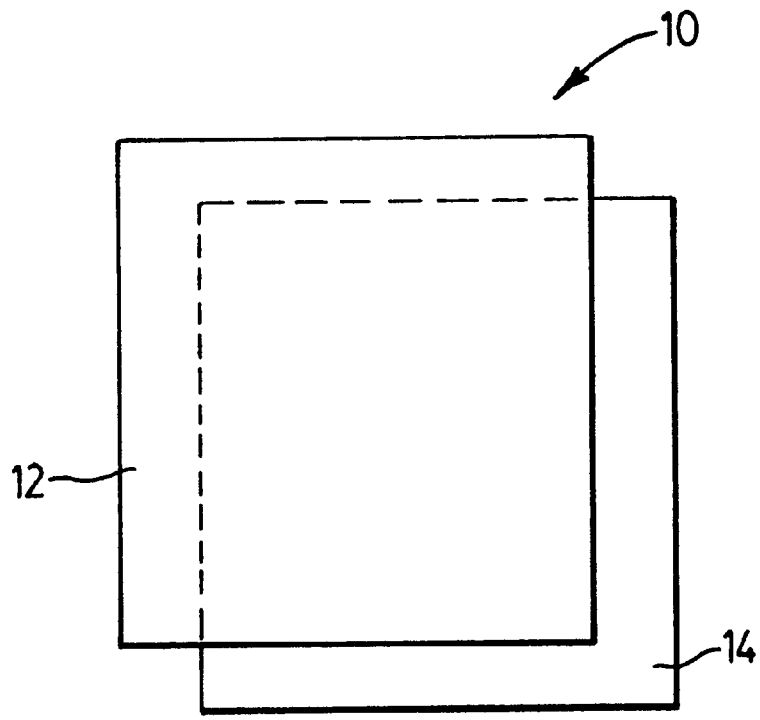
FIG. 4 is a plan view of an alternate embodiment of an EMF shield according to the present invention.
Figure 6:
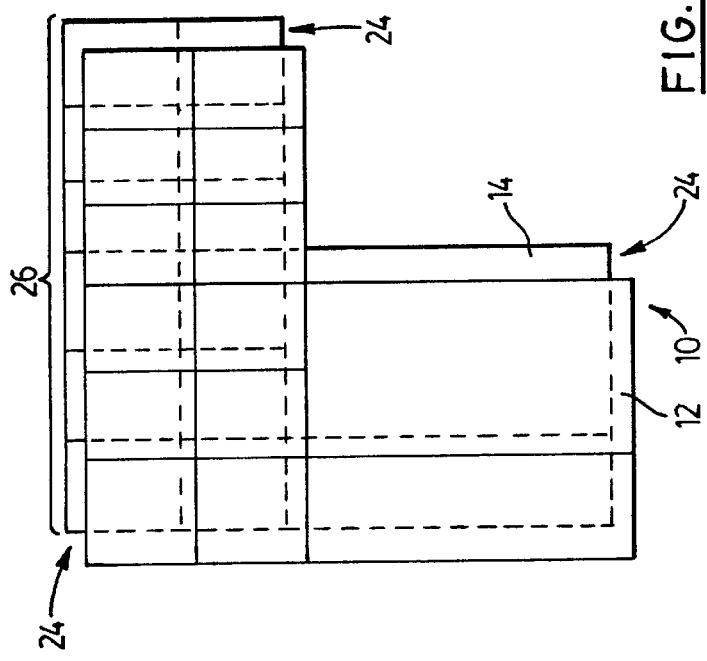
FIG. 6 is a front elevation of an EMF shield wall according to the present invention; and, FIG. 7 is an end elevation showing the interface between two adjacent EMF shield panels according to the present invention.

The EMF shield panels 10 may be placed adjacent one another as shown in FIG. 6 to build up a wall of desired dimensions. Although reasonably effective shielding could probably be achieved with gaps as large as 10 mm between the edges of adjacent panels, it is preferable to avoid such gaps by horizontally and vertically offsetting the first sheet 12 and second sheet 14 as shown in FIGS. 4 through 6 to present stepped edges 24 in FIG. 5. Even better shielding may be provided if in addition to having the EMF shield panels 10 offset, the individual sheets 10 and 14 are also offset to provide additional stepped edges as shown by reference 32 in FIG. 5.

The stepped edges 24 and 32 allow the EMF shield panels to be installed without gaps by overlapping the stepped edges 24 as shown in FIG. 6 to form an EMF shield wall 26. Although the EMF shield panels 10 could be of any shape that enables adjacent stepped edges 24 to overlap, it is expected that a rectangular configuration is the easiest to manufacture and most versatile to install.

Figure 7:
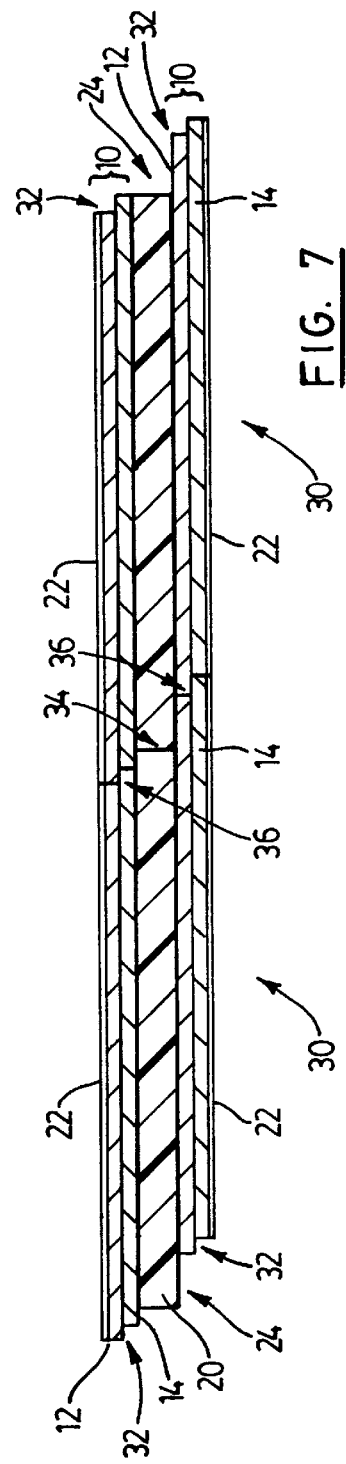

FIG. 7 illustrates the manner in which edges of adjacent EMF shield panels 30 are juxtaposed. The overlapping of the stepped edges 24 is illustrated at reference 34. The overlapping of the additional stepped edges is illustrated at reference 36.

Figure 1:
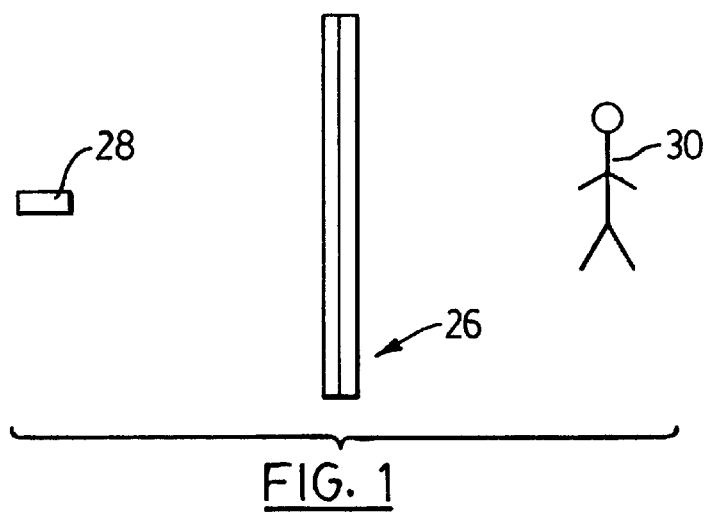
FIG. 1 diagramatically illustrates the placement of an EMF shield according to the present invention relative to an EMF source and a person being shielded.

As shown in FIG. 1, the EMF shield wall 26 is positioned between an EMF source 28 and a critical volume such as the space occupied by a person 30 in FIG. 1. This of course contrasts with the prior practises of either encapsulating the EMF source 28 to contain the field about the source or completely encapsulating the critical volume.

It has been found that using an EMF shield panel 10 made from two pairs of sheets of Nippon Steel Corp Laser-Scribed Lamination steel (ZDKH designation) of 0.27 mm thickness placed in front of an EMF source of 1000 MG (milli-gauss), a field reduction exceeding a ratio of 10:1 may be achieved. If greater reductions are required, for example in the case of higher field strengths, further EMF shield panels 10 may be stacked one above the other.

The invention is further illustrated by the following examples:

EXAMPLE 1

An EMF shield as described above was built up from two sets of cross-oriented EMF panels with a 10 mm air spacing therebetween. Each of the panels was made up of 2 sheets of Nippon Steel Corp Laser-Scribed Lamination steel (ZDKH designation) of 0.27 mm thickness. An EMF source emitting 1,000 mG was placed adjacent one face of the EMF panel shield. An EMF detector was placed adjacent the EMF shield on the side opposite from that of the EMF source. The detector detected an EMF intensity of 61 mG behind the shield which correlates to a field reduction ratio of 16.393:1.

EXAMPLE 2

An EMF shield panel was constructed generally in accordance with the panel described in Example 1 above, but with a 20 mm air spacing rather than a 10 mm air spacing. Using the same source and detector arrangement as described above in Example 1, it was found that the field intensity behind the shield was 56 mG corresponding to a field reduction ratio of 17.857:1.

The above description is intended in an illustrative rather than a restrictive sense. Variations to the above description may be apparent to appropriately skilled persons without departing from the spirit and scope of the invention as defined by the claims set out below.

The embodiments of the invention in which an exclusive property or privilege is claimed are defined as follows:

1. A low frequency EMF shield comprising a generally parallel pair of EMF shield panels with a non-magnetic spacer sheet interposed therebetween, each of said shield panels having:
   a first sheet of domain refined steel having a direction of high magnetic permeability ("an easy direction") parallel to a first axis; and,
   a second sheet of domain refined steel having an easy direction generally orthogonal to said easy direction of said first sheet.

2. A low frequency EMF shield as claimed in claim 1 wherein at least outer faces of said EMF shield panels are coated with a corrosion inhibiting coating.

3. A low frequency EMF shield as claimed in claim 2 wherein said corrosion inhibiting coating is an epoxy.

4. A low frequency EMF shield as claimed in claim 1, 3 or 4 wherein said pair of EMF shield panels is offset to present stepped edges.

5. A low frequency EMF shield as claimed in claim 4 wherein said first and second sheets of each of said pair of EMF shield panels are also offset to provide additional stepped edges.

6. A low frequency EMF shield wall comprising a plurality of low frequency EMF shields each of said EMF shields further comprising a pair of EMF shield panels with a non-magnetic spacer sheet interposed therebetween, each of said EMF shield panels having:
   a first sheet of domain refined steel having a direction of high magnetic permeability ("an easy direction") parallel to a first axis; and,
   a second sheer of domain refined steel having an easy direction generally orthogonal to an easy direction of said first sheet;
wherein said EMF shields are arranged in a generally planar configuration with corresponding edges of adjacent sheets generally adjacent one another.

7. A low frequency EMF shield wall as claimed in claim 6 wherein at least outer faces of said EMF shield panels are coated with a corrosion inhibiting coating.

8. A low frequency EMF shield wall as claimed in claim 7 wherein said corrosion inhibiting coating is an epoxy.

9. A low frequency EMF shield wall as claimed in claim 6 wherein said pair of EMF shield panels is offset to present stepped edges and said EMF shields are arranged with adjacent of said stepped edges overlapping.

10. A low frequency EMF shield wall as claimed in claim 9 wherein at least outer faces of said EMF shield panels are coated with a corrosion inhibiting coating.

11. A low frequency EMF shield wall as claimed in claim 10 wherein said corrosion inhibiting coating is an epoxy.

12. A low frequency EMF shield wall as claimed in claim 9 wherein said first and second sheets of each of said pair of EMF shield panels are also offset to provide additional stepped edges and said EMF shields are arranged with adjacent of said additional stepped edges overlapping.

13. A low frequency EMF shield wall as claimed in claim 12 wherein at least outer faces of said EMF shield panels are coated with a corrosion inhibiting coating.

14. A low frequency EMF shield wall as claimed in claim 13 wherein said corrosion inhibiting coating is an epoxy.

* * * * *